United States Patent
VanGilder et al.

(10) Patent No.: US 10,025,330 B2
(45) Date of Patent: Jul. 17, 2018

(54) METHOD AND APPARATUS FOR CHARACTERIZING THERMAL TRANSIENT PERFORMANCE

(71) Applicant: SCHNEIDER ELECTRIC IT CORPORATION, West Kingston, RI (US)

(72) Inventors: James William VanGilder, Pepperell, MA (US); Christopher M. Healey, Tewksbury, MA (US); Xuanhang Zhang, North Reading, MA (US); Zachary Pardey, Waltham, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 321 days.

(21) Appl. No.: 14/429,980

(22) PCT Filed: Sep. 21, 2012

(86) PCT No.: PCT/US2012/056763
§ 371 (c)(1),
(2) Date: Mar. 20, 2015

(87) PCT Pub. No.: WO2014/046677
PCT Pub. Date: Mar. 27, 2014

(65) Prior Publication Data
US 2015/0234397 A1    Aug. 20, 2015

(51) Int. Cl.
*G06F 17/50*   (2006.01)
*G05B 13/04*   (2006.01)
(Continued)

(52) U.S. Cl.
CPC ......... *G05D 23/1917* (2013.01); *G05B 13/04* (2013.01); *G06F 11/3058* (2013.01); *G06F 17/5009* (2013.01)

(58) Field of Classification Search
CPC . G05B 13/04; G06F 11/3058; G06F 17/5009; G06F 11/3508; G05D 23/1917
See application file for complete search history.

(56) References Cited

U.S. PATENT DOCUMENTS 5,682,949 A   11/1997 Ratcliffe et al.
5,995,729 A   11/1999 Hirosawa et al.
(Continued)

FOREIGN PATENT DOCUMENTS

AU   2012201080 A1   3/2012
CN   101089779 A    12/2007
(Continued)

OTHER PUBLICATIONS

Gilbert, R. Validation of Computational Fluid Dynamics Based Data Center Cyber-Physical Models. Arizona State University. May 2012. [Retrieved Feb. 21, 2013].[Retrieved from internet: <URL:http://impact.asu.edu/thesis/Robin_thesis.pdf>]. entire document.

(Continued)

*Primary Examiner* — Bryan Bui
(74) *Attorney, Agent, or Firm* — Lando & Anastasi, LLP

(57) ABSTRACT

A system and method for evaluating equipment in a data center is disclosed, hi one aspect, a method includes receiving parameters for equipment in the data center, the parameters including information descriptive of mass of the equipment, calculating an idealized thermal mass of the equipment based on the received parameters, calculating a temperature associated with the equipment at a first time period of a plurality of time periods based on the idealized thermal mass, and calculating a temperature for each subsequent time period of the plurality of time periods based on the idealized thermal mass and the temperature at a previous time period of the plurality of time periods.

18 Claims, 11 Drawing Sheets

(51) Int. Cl.
  *G05D 23/19*     (2006.01)
  *G06F 11/30*     (2006.01)

(56)        References Cited

U.S. PATENT DOCUMENTS

| | | | |
|---|---|---|---|
| 6,134,511 | A | 10/2000 | Subbarao |
| 6,574,104 | B2 | 6/2003 | Patel et al. |
| 6,694,759 | B1 | 2/2004 | Bash et al. |
| 6,714,977 | B1 | 3/2004 | Fowler et al. |
| 6,718,277 | B2 | 4/2004 | Sharma |
| 6,889,908 | B2 | 5/2005 | Crippen et al. |
| 7,031,870 | B2 | 4/2006 | Sharma et al. |
| 7,051,946 | B2 | 5/2006 | Bash et al. |
| 7,197,433 | B2 | 3/2007 | Patel et al. |
| 7,334,630 | B2 | 2/2008 | Goodson et al. |
| 7,426,453 | B2 | 9/2008 | Patel et al. |
| 7,558,649 | B1 | 7/2009 | Sharma et al. |
| 7,657,347 | B2 | 2/2010 | Campbell et al. |
| 7,676,280 | B1 | 3/2010 | Bash et al. |
| 7,791,882 | B2 | 9/2010 | Chu et al. |
| 7,832,925 | B2 | 11/2010 | Archibald et al. |
| 7,885,795 | B2 | 2/2011 | Rasmussen et al. |
| 7,908,126 | B2 | 3/2011 | Bahel et al. |
| 7,925,389 | B2 | 4/2011 | Bradicich et al. |
| 8,201,028 | B2 | 6/2012 | Sawczak et al. |
| 8,209,056 | B2 | 6/2012 | Rasmussen et al. |
| 8,244,502 | B2 | 8/2012 | Hamann et al. |
| 8,322,155 | B2 | 12/2012 | Tutunoglu et al. |
| 8,327,656 | B2 | 12/2012 | Tutunoglu et al. |
| 8,473,265 | B2 | 6/2013 | Hlasny et al. |
| 8,509,959 | B2 | 8/2013 | Zhang et al. |
| 8,639,482 | B2 | 1/2014 | Rasmussen et al. |
| 8,825,451 | B2 | 9/2014 | VanGilder et al. |
| 8,965,748 | B2 | 2/2015 | Iyengar et al. |
| 2003/0115024 | A1 | 6/2003 | Snevely |
| 2003/0158718 | A1 | 8/2003 | Nakagawa et al. |
| 2004/0240514 | A1 | 12/2004 | Bash et al. |
| 2004/0262409 | A1 | 12/2004 | Crippen et al. |
| 2005/0023363 | A1 | 2/2005 | Sharma et al. |
| 2005/0182523 | A1 | 8/2005 | Nair |
| 2005/0267639 | A1 | 12/2005 | Sharma et al. |
| 2006/0015712 | A1 | 1/2006 | Ang et al. |
| 2006/0080001 | A1 | 4/2006 | Bash et al. |
| 2006/0214051 | A1 | 9/2006 | Bash et al. |
| 2007/0038414 | A1 | 2/2007 | Rasmussen et al. |
| 2007/0078635 | A1 | 4/2007 | Rasmussen et al. |
| 2007/0174024 | A1 | 7/2007 | Rasmussen et al. |
| 2007/0291817 | A1 | 12/2007 | Bradicich et al. |
| 2008/0004837 | A1 | 1/2008 | Zwinger et al. |
| 2008/0174954 | A1 | 7/2008 | VanGilder et al. |
| 2009/0138888 | A1 | 5/2009 | Shah et al. |
| 2010/0286956 | A1 | 11/2010 | VanGilder et al. |
| 2010/0305718 | A1 | 12/2010 | Clark et al. |
| 2011/0215645 | A1* | 9/2011 | Schomburg ............ H02J 9/061 307/65 |
| 2011/0301911 | A1 | 12/2011 | VanGilder et al. |
| 2011/0316706 | A1 | 12/2011 | Cash et al. |
| 2012/0041569 | A1 | 2/2012 | Zhang et al. |
| 2012/0232877 | A1* | 9/2012 | Bhagwat ............ H05K 7/20836 703/13 |
| 2012/0245905 | A1 | 9/2012 | Dalgas et al. |
| 2012/0253769 | A1 | 10/2012 | Poondru et al. |
| 2013/0030585 | A1 | 1/2013 | Rasmussen et al. |
| 2013/0139530 | A1 | 6/2013 | Tutunoglu et al. |
| 2013/0297267 | A1 | 11/2013 | Liang et al. |
| 2014/0358471 | A1* | 12/2014 | VanGilder ........... G06F 17/5004 702/130 |

FOREIGN PATENT DOCUMENTS

| | | |
|---|---|---|
| CN | 101589656 A | 11/2009 |
| CN | 201514313 U | 6/2010 |
| CN | 102096460 A | 6/2011 |
| CN | 102414686 A | 4/2012 |
| CN | 102449606 A | 5/2012 |
| EP | 2147585 A2 | 1/2010 |
| EP | 2482213 A1 | 8/2012 |
| WO | 2006119248 A2 | 11/2006 |
| WO | 2010068434 A1 | 6/2010 |
| WO | 2012037427 A1 | 3/2012 |
| WO | 2012082985 A2 | 6/2012 |
| WO | 2012135038 A1 | 10/2012 |
| WO | 2013/095494 A1 | 6/2013 |

OTHER PUBLICATIONS

Jack P. Holman: "Chapter 3 Steady-State Conduction-Multiple Dimensions" In: "Heat Transfer", 2002, McGraw Hill, XP055273397, pp. 71-130.

Vanessa Lopez et al: "Heat transfer modeling in data centers", International Journal of Heat and Mass Transfer, vo 1 . 54, No. 25, Sep. 15, 2011 (Sep. 15, 2011), pp. 5306-5318, XP028298268, ISSN: 0017-9310, DOI: 10.1016/j.ijheatmasstransfer.2011.08.012 [retrieved on Aug. 10, 2011].

Notification of Transmittal of the International Search Report and the Written Opinion of the International Searching Authority from corresponding PCT/US2012/056763 dated Dec. 6, 2012.

"Management Strategy for Network Critical Physical Infrastructure", American Power Conversion, Dec. 15, 2003, published on World Wide Web. 10 pages.

"Optimizing facility operation in high density data center environments," 2007, Hewlett-Packard Development , Company, pp. 1-25.

APC User's Guide Brochure, "InfraStruXure Manager," Mar. 2004, 181 pgs.

Ashrae, "Thermal Guidelines for Data Processing Environments" 2004, Atlanta: American Society of Heating, Refrigerating, and Air-Conditioning Engineers, Inc., 2004, Atlanta.

Bash C. E. et al.: "Balance of Power: Dynamic Thermal Management for Internet Data Centers", IEEE Internet Computing , Jan. 1, 2005, pp. 42-49, vol. 9, No. 1, IEEE Service Center, New York, NY.

Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Beaty et al., "High Density Cooling of Data Centers and Telecom Facilities-Part 2," 2005, ASHRAE Transactions, vol. 111, pp. 932-944.

Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s10619-005-0413-0.

Bemis et al, Data Center Airflow Modeling: Helps Facilities Planners Make Informed Decisions. Applied Math Modeling Inc. 2009 [retrieved on Apr. 19, 2012). Retrieved from the Internet: <URL: http:I/www.coolsimsoftware.com/wwwrooULinkCiick. aspx?fileticket=r1 SqFUDtRTk%3D&tabid=189> entire document.

Chandrakant D. Patel, et al., "Thermal Considerations in Cooling Large Scale High Copute Density Data Centers" IEEE 2002, pp. 767-776.

Chen, Q.and Srebric, J., "Simplified Diffuser Boundary Conditions for Numerical Room Airflow Models," Final Report for ASHRAE RP-1009, Department of Architecture, Massachusetts Institute of Technology, Cambridge, MA, 2000, 181 pages.

Herrlin, M.K., "Rack Cooling Effectiveness in Data Centers and Telecom Central Offices: The Rack Cooling Index (RCI)," ASHRAE Transaction, 2005, pp. 725-731, vol. 111(2).

Innovative Research, Inc., http://web.archive.org/web/20051221005029/http://www.inres.com/, Dec. 21, 2005, published on World Wide Web.

K. Dunlap, "Cooling Audit for Identifying Potential Cooling Problems in Data Centers", White Paper #40, pp. 1-18, American Power Conversion, May 20, 2004, published on World Wide Web.

Marwah, M.; Sharma, R.; Shih, R.; Patel, C.; Bhatia, V.; Mekanapurath, M.; Velumani, R.; Velayudhan, S., 2009, Data analysis, visualization and knowledge discovery in sustainable data centers, In Proceedings of the 2nd Bangalore Annual Compute Conference (Compute '09).

(56) References Cited

OTHER PUBLICATIONS

N. Rasmussen, "Calculating Total Cooling Requirements for Data Centers", White Paper #25, pp. 1-8, American Power Conversion, May 20, 2004, published on World Wide Web.

N. Rasmussen, "Cooling Strategies for Ultra-High Density Racks and Blade Servers", White Paper #46, pp. 1-22, American Power Conversion, Mar. 29, 2005, published on World Wide Web.

N. Rasmussen, "Strategies for Deploying Blade Servers in Existing Data Centers", White Paper #125, pp. 1-14, American Power Conversion, Mar. 29, 2005, published on World Wide Web.

Schmidt et al., "Best practices for data center thermal and energy management-review of literature," ASHRAE Transactions, vol. 112, pp. 206-218 [2007].

Sharma, R.K, Bash, C.E., and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.

Sinha et al., "Numerical simulation of two-dimensional room air flow with and without buoyancy", Energy and Buildings, vol. 32, Issue 1, Jun. 2000, pp. 121-129.

Vangilder et al., "Partially decoupled aisle method for estimating rack-cooling performance in near-real time," 2007, Proceedings of the IPACK2007 ASME InterPACK07, pp. 781-789.

Vangilder, Real-Time Data Center Cooling Analysis, APC by Schneider Electric, Billerica, MA USA, Electronics Cooling, Sep. 2011, pp. 14-16.

Verhoff, A., The Two-Dimensional, Turbulent Wall Jet with and without an External Free Stream, Office of Naval Research Department of the Navy Contact Nonr 1858(14) in Co-Operation with Bureau of Naval Weapons, Report No. 626, May 1963.

Norrefeldt, Victor, Gunnar Grun, and Klaus Sedlbauer. "VEPZO-Velocity propagating zonal model for the estimation of the airflow pattern and temperature distribution in a confined space." Building and Environment 48 (Feb. 2012): 183-194.

* cited by examiner

METHOD AND APPARATUS FOR CHARACTERIZING THERMAL TRANSIENT PERFORMANCE

This application is a U.S. National Stage Application under 35 U.S.C. § 371 of International Application No. PCT/US2012/056763, filed Sep. 21, 2012, which is hereby incorporated herein by reference in its entirety.

BACKGROUND

Field of the Invention

At least one embodiment in accordance with the present invention relates generally to systems and methods for data center management and design, and more specifically, to systems and methods for characterizing the idealized thermal mass of equipment in a data center.

Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in specialized enclosures termed "racks" which integrate these connectivity, power and cooling elements. In some data center configurations, these rows are organized into hot and cold aisles to decrease the cost associated with cooling the information technology equipment. A raised floor having an air plenum beneath the floor is typically used for providing cooling air to the racks. Cool air is distributed from the air plenum to the racks through perforated tiles having open areas.

Various processes and software applications, such as the data center management systems available from American Power Conversion (APC) Corporation by Schneider Electric of West Kingston, R.I., have been developed to aid data center personnel in designing and maintaining efficient and effective data center configurations. These tools often guide data center personnel through activities such as designing the data center structure, positioning equipment within the data center prior to installation and repositioning equipment after construction and installation are complete. Thus, conventional tool sets provide data center personnel with a standardized and predictable design methodology.

SUMMARY

According to one aspect, a computer-implemented method for evaluating cooling performance in a data center is disclosed. In one example, the method comprises receiving parameters for equipment in the data center, the parameters including information descriptive of mass of the equipment, calculating an idealized thermal mass of the equipment based on the received parameters, calculating a temperature associated with the equipment at a first time period of a plurality of time periods based on the idealized thermal mass, and calculating a temperature for each subsequent time period of the plurality of time periods based on the idealized thermal mass and the temperature at a previous time period of the plurality of time periods.

In the method, receiving the parameters for the equipment includes receiving information descriptive of at least one of a server and an equipment rack. Further, in the method receiving the parameters includes receiving, via a user interface, information descriptive of at least one of an input temperature, a power dissipation, an airflow, a specific heat, a thermal effectiveness, and a position of an effective heat source relative to the mass. The method may further comprise providing default values for the parameters via the user interface, the default values being predetermined measurements of at least one of a thermal effectiveness of the equipment and a position of an effective heat source relative to the mass of the equipment.

In the method, calculating the idealized thermal mass comprises calculating the idealized thermal mass based on internal heat transfer characteristics through the equipment and physical thermal properties of the equipment. In addition, calculating the idealized thermal mass based on internal heat transfer characteristics through the equipment includes calculating the idealized thermal mass based on at least one of a heat transfer coefficient of the equipment, an amount of surface area of contact between airflow and the equipment, a thermal effectiveness of the equipment, a time constant of the equipment, a specific heat of air, an airflow rate, and a position of an effective heat source relative to the mass of the equipment. Further, calculating the idealized thermal mass based on the physical thermal properties of the equipment includes calculating the idealized thermal mass based on at least one of a specific heat of the equipment and the mass of the equipment.

In the method, calculating the temperature associated with the equipment includes calculating an effective temperature and an exhaust temperature and calculating the temperature for each subsequent time period includes calculating an effective temperature and an exhaust temperature.

According to another aspect, a system for evaluating equipment in a data center is disclosed. In one example, the system comprises an interface configured to receive parameters for the equipment in the data center, including information relating to mass of the equipment, and a controller coupled to the interface and configured to calculate a idealized thermal mass of the equipment based on the received parameters, calculate a temperature associated with the equipment at a first time period of a plurality of time periods based on the idealized thermal mass, and calculate a temperature for each subsequent time period of the plurality of time periods based on the idealized thermal mass and the temperature at a previous time period of the plurality of time periods.

In the system, the equipment may comprise at least one of a server and an equipment rack. In addition, the interface may be further configured to receive the parameters by receiving information descriptive of at least one of an input temperature, a power dissipation, an airflow, a specific heat, a thermal effectiveness, and a position of an effective heat source relative to the mass. In one example, the interface may be further configured to provide default values for the parameters, the default values being predetermined measurements of at least one of a thermal effectiveness of the equipment and a position of an effective heat source relative to the mass of the equipment.

In the system, the controller may be further configured to calculate the idealized thermal mass based on internal heat transfer characteristics through the equipment and physical thermal properties of the equipment. Further in the system, the controller may be configured to calculate the idealized thermal mass based on internal heat transfer characteristics through the equipment by calculating the idealized thermal mass based on at least one of a heat transfer coefficient of the equipment, an amount of surface area of contact between airflow and the equipment, a thermal effectiveness of the equipment, a time constant of the equipment, a specific heat of air, an airflow rate, and a position of an effective heat source relative to the mass of the equipment.

In the system, the controller may be further configured to calculate the idealized thermal mass based on the physical thermal properties of the equipment by calculating the idealized thermal mass based on at least one of a specific heat of the equipment and the mass of the equipment. The controller may be further configured to calculate the temperature associated with the equipment by calculating an effective temperature and an exhaust temperature and calculate the temperature for each subsequent time period by calculating an effective temperature and an exhaust temperature.

According to another aspect, a method for measuring parameters of equipment in a data center using a measurement apparatus is disclosed. In one example, the method comprises receiving parameters for equipment in the data center, the parameters including information descriptive of mass of the equipment, calculating an estimated output temperature for each of a plurality of time periods based on an estimated idealized thermal mass, varying airflow rate and power dissipation associated with the equipment at a predetermined rate using the measurement apparatus, varying input temperature of the equipment over the plurality of time periods using the measurement apparatus, measuring, using the measurement apparatus, output temperature of airflow through an exhaust of the equipment using the measurement apparatus, and calculating an updated idealized thermal mass such that the estimated output temperature is configured to be equivalent to the measured output temperature.

The method may further comprise calculating the estimated idealized thermal mass based on internal heat transfer characteristics through the equipment and physical thermal properties of the equipment. In one example, the method further comprises increasing airflow and power dissipation for the equipment at until reaching maximum airflow and maximum power dissipation values, and measuring the output temperature for each of the plurality of time periods. In addition, the method may further comprise calculating a position of an effective heat source relative to the mass of the equipment such that the estimated output temperature is configured to be equivalent to the measured output temperature.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
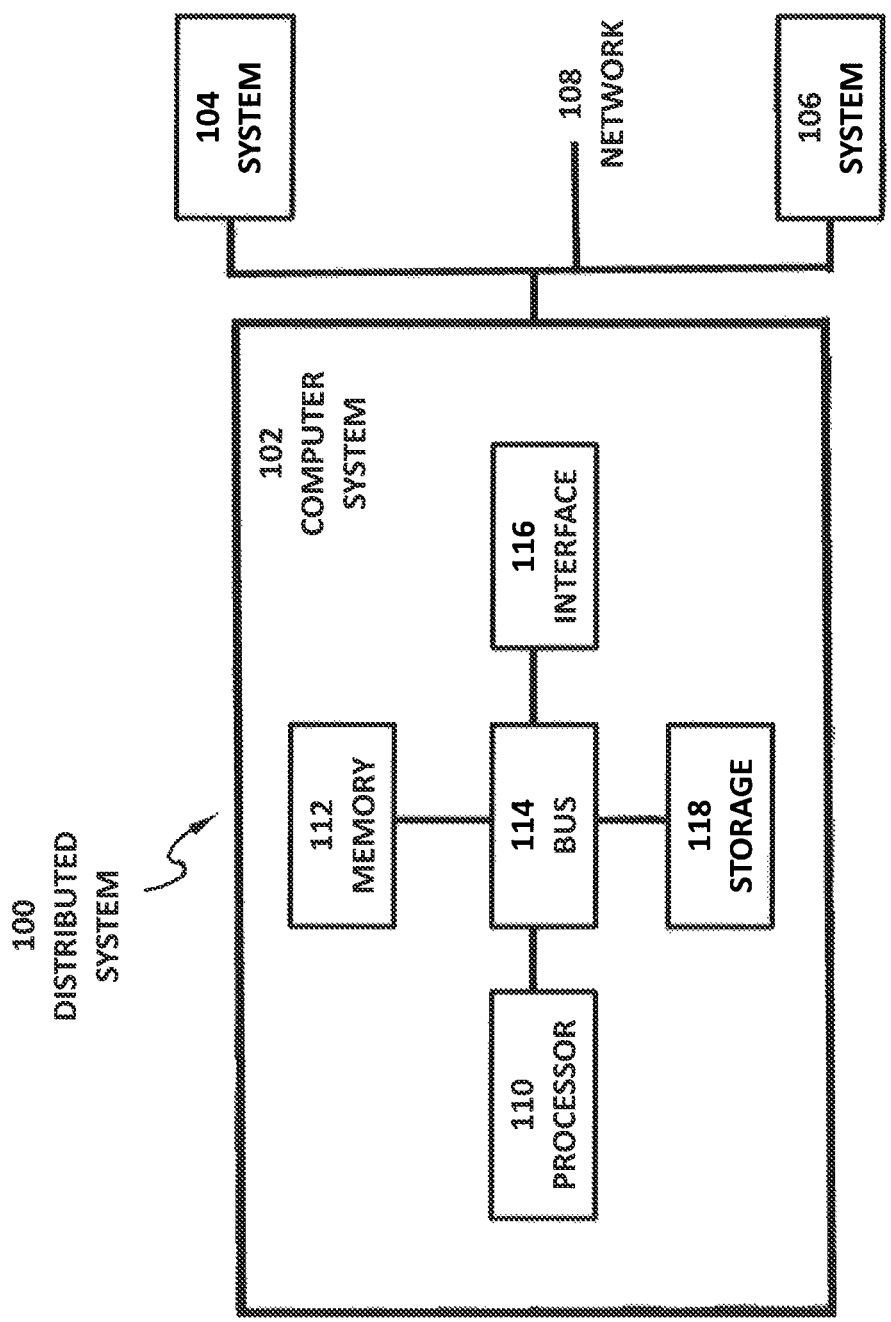
FIG. 1 is a block diagram of one example of a computer system with which various aspects in accord with the present invention may be implemented.

At least some embodiments in accordance with the present invention relate to systems and processes through which a user may design and analyze data center configurations. These systems and processes may facilitate this design and analysis activity by allowing the user to create models of data center configurations from which performance metrics may be determined. Both the systems and the user may employ these performance metrics to determine alternative data center configurations that meet various design objectives. According to one embodiment, systems and methods described herein provide for a characterization and measurement of "idealized thermal mass" of a server, which is subsequently included in models of data centers that reflect transient states of equipment. Such an understanding of transient states may allow the data center designer or operator to prepare the data center for potential transient events. According to another embodiment, an experimental apparatus is described herein that can be used to measure idealized thermal mass properties of the server and determine the effects of the different transient scenarios on different temperature characteristics of the server.

As described in U.S. patent application Ser. No. 12/019,109, titled "System and Method for Evaluating Equipment Rack Cooling", filed Jan. 24, 2008 (referred to herein as "the '109 application"), and in U.S. patent application Ser. No. 11/342,300, titled "Methods and Systems for Managing Facility Power and Cooling" filed Jan. 27, 2006 (referred to herein as "the '300 application"), each of which is assigned to the assignee of the present application, and each of which is hereby incorporated herein by reference in its entirety, typical equipment racks in modern data centers draw cooling air into the front of the rack and exhaust air out of the rear of the rack. The equipment racks and in-row coolers are typically arranged in rows in an alternating front/back arrangement creating alternating hot and cool aisles in a data center with the front of each row of racks facing the cool aisle and the rear of each row of racks facing the hot aisle. Adjacent rows of equipment racks separated by a cool aisle may be referred to as a cool aisle cluster, and adjacent rows of equipment racks separated by a hot aisle may be referred to as a hot aisle cluster. Further, single rows of equipment may also be considered to form both a cold and a hot aisle cluster by themselves. A row of equipment racks may be part of multiple hot aisle clusters and multiple cool aisle clusters. In descriptions and claims herein, equipment in racks, or the racks themselves, may be referred to as cooling consumers, and in-row cooling units and/or computer room air conditioners (CRACs) may be referred to as cooling providers. In the referenced applications, tools are provided for analyzing the cooling performance of a cluster of racks in a data center. In these tools, multiple analyses may be performed on different layouts to attempt to optimize the cooling performance of the data center.

The equipment racks in the data centers may include a plurality of different types of devices. In one example, a server may be included in the equipment rack. For example, a server may be a physical server, a dedicated server, or a virtual server. A physical server generally includes hardware where an operating system is run. A dedicated server generally includes a service application running on a physical server. For example, a dedicated server may include a web service or file transfer protocol (FTP) service on an operating system, where the service application can be coupled to the physical server. A virtual server can include a service that is independent of physical server hardware. In one embodiment, there can be one dedicated server operating system per physical server and multiple virtual servers per physical server. A virtual server can run concurrent with (e.g., on top of) a dedicated server.

Further, in Patent Cooperation Treaty Application No. PCT/US2011/066877, titled "ANALYSIS OF EFFECT OF TRANSIENT EVENTS ON TEMPERATURE IN A DATA CENTER," filed Dec. 22, 2011, (referred to herein as "the PCT/US2011/066877 application"), which is assigned to the assignee of the present application, and which is hereby incorporated herein by reference in its entirety, the effects of transient events such as enablement or a failure of a portion of a cooling system or enablement or disablement of a heat producing piece of equipment are described. The PCT/US2011/066877 application describes the effects of transient events and airflow analyses performed to predict airflow and temperatures for a proposed layout of a data center equipment and also can also provide prediction of cooling performance for an installed or planned data center.

The aspects disclosed herein in accordance with the present embodiments, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. Further, computer systems in embodiments may be used to automatically measure environmental parameters in a data center, and control equipment, such as chillers or coolers to optimize performance. Moreover, the systems described herein may be configured to include or exclude any of the functions discussed herein. Thus the embodiments are not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accordance with the present embodiments may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accordance with the present embodiments may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the embodiments are not limited to executing on any particular system or group of systems. Further, aspects may be implemented in software, hardware or firmware, or any combination thereof. Thus, aspects in accordance with the present embodiments may be implemented within methods, acts, systems, system elements and components using a variety of hardware and software configurations, and the embodiments are not limited to any particular distributed architecture, network, or communication protocol.

FIG. 1 shows a block diagram of a distributed computer system 100, in which various aspects and functions in accord with the present embodiments may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, Ethernet, wireless Ethernet, Bluetooth, TCP/IP, UDP, Http, FTP, SNMP, SMS, MMS, SS7, Json, Soap, and Corba. To ensure data transfer is secure, computer systems 102, 104 and 106 may transmit data via network 108 using a variety of security measures including TLS, SSL or VPN among other security techniques. While distributed computer system 100 illustrates three networked computer systems, distributed computer system 100 may include any number of computer systems and computing devices, networked using any medium and communication protocol.

Various aspects and functions in accordance with the present embodiments may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Motorola PowerPC, SGI MIPS, Sun UltraSPARC, or Hewlett-Packard PA-RISC processor, but may be any type of processor, multi-processor, microprocessor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any device for storing data, such as a disk drive or other non-volatile, non-transitory, storage device. Various embodiments in accordance with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI and InfiniBand. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable, nonvolatile, non-transitory, storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then may copy the data to the medium associated with storage system 118 after processing is completed. A variety of components may manage data movement between the medium and integrated circuit memory element and the presently described embodiments are not limited thereto. Further, the embodiments are not limited to a particular memory system or data storage system.

Although computer system 102 is shown by way of example as one type of computer system upon which various aspects and functions in accordance with the present embodiments may be practiced, any aspects of the presently disclosed embodiments are not limited to being implemented on the computer system as shown in FIG. 1. Various aspects and functions in accord with the presently disclosed embodiments may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS System X with Motorola PowerPC processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and embodiments are not limited to any particular implementation.

The processor and operating system together define a computer platform for which application programs in high-level programming languages may be written. These component applications may be executable, intermediate, for example, C−, bytecode or interpreted code which communicates over a communication network, for example, the Internet, using a communication protocol, for example, TCP/IP. Similarly, aspects in accord with the presently disclosed embodiments may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the presently disclosed embodiments may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the presently disclosed embodiments are not limited to a specific programming language and any suitable programming language could also be used.

A computer system included within an embodiment may perform additional functions outside the scope of the presently disclosed embodiments. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB, a subsidiary of Oracle or integration software such as Web Sphere middleware from IBM of Armonk, N.Y. However, a computer system running, for example, SQL Server may be able to support both aspects in accord with the presently disclosed embodiments and databases for sundry applications.

Example System Architecture

Figure 2:
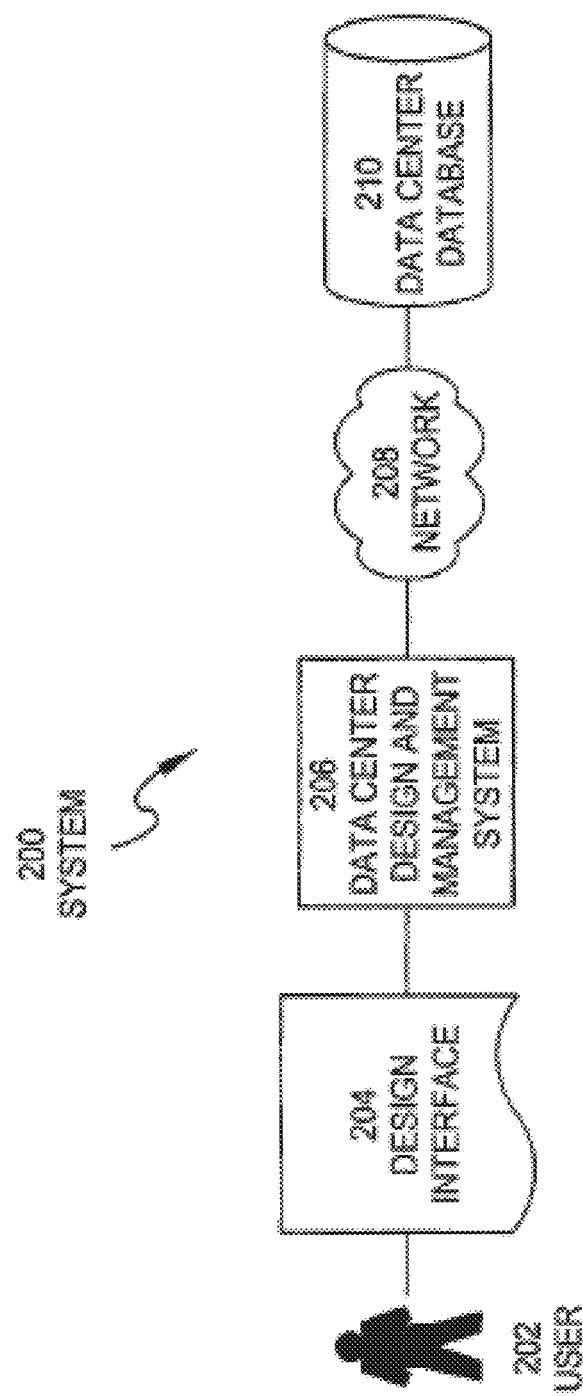
FIG. 2 is a schematic of one example of a distributed system including a data center management system.

FIG. 2 presents a context diagram including physical and logical elements of distributed system 200. As shown, distributed system 200 is specially configured in accordance with the presently disclosed embodiments. The system structure and content recited with regard to FIG. 2 is for exemplary purposes only and is not intended to limit the embodiments to the specific structure shown in FIG. 2. As will be apparent to one of ordinary skill in the art, many variant system structures can be architected without deviating from the scope of the presently disclosed embodiments. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the presently disclosed embodiments.

Referring to FIG. 2, system 200 includes user 202, interface 204, data center design and management system 206, communications network 208 and data center database 210. System 200 may allow user 202, such as a data center architect or other data center personnel, to interact with interface 204 to create or modify a model of one or more data center configurations. According to one embodiment, interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety (referred to herein as "the PCT/US08/63675 application"). In other embodiments, interface 204 may be implemented with specialized facilities that enable user 202 to design, in a drag and drop fashion, a model that includes a representation of the physical layout of a data center or any subset thereof. This layout may include representations of data center structural components as well as data center equipment. The features of interface 204 are discussed further below, as may be found in various embodiments disclosed herein. In at least one embodiment, information regarding a data center is received by the system 200 through the interface, and assessments and recommendations for the data center are provided to the user. Further, in at least one embodiment, optimization processes may be performed to optimize cooling performance and energy usage of the data center.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information needed to support the features and functions of data center design and management system 206. For example, in one embodiment, data center database 210 may include at least some portion of the data stored in the data center equipment database described in PCT/US08/63675. In another embodiment, this information may include any information needed to support interface 204, such as, among other data, the physical layout of one or more data center model configurations, the production and distribution characteristics of the cooling providers included in the model configurations, the consumption characteristics of the cooling consumers in the model configurations, and a listing of equipment racks and cooling providers to be included in a cluster.

In one embodiment, data center database 210 may store information pertaining to types of cooling providers, the amount of cool air provided by each type of cooling provider, and a temperature of cool air provided by the cooling provider. Thus, for example, data center database 210 includes records pertaining to a particular type of CRAC unit that is rated to deliver airflow at the rate of 5,600 cubic feet per minute (cfm) at a temperature of 68 degrees Fahrenheit. In addition, the data center database 210 may store information pertaining to one or more cooling metrics, such as inlet and outlet temperatures of the CRACs and inlet and exhaust temperatures of one or more equipment racks. The temperatures may be periodically measured and input into the system, or in other embodiments, the temperatures may be continuously monitored using devices coupled to the system 200.

In another embodiment, data center database 210 may store information pertaining to the types of computing or IT (Information Technology) devices (such as servers), and may further include information pertaining to server weight, estimated heat capacity for the server, maximum CPU loading capacity, as well as other information.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. The embodiments described herein are not limited to a specific number of users or systems.

Transient Thermal Characteristics

According to one embodiment, systems and methods described herein provide for a characterization and measurement of the idealized thermal mass" of a server, which is subsequently included in numerical models of data centers describing transient scenarios and used in design and evaluation of data centers. According to various examples included herein, "the idealized thermal mass" may be defined as characteristics related to the ability of a data center device to absorb or release heat as the internal temperature and/or internal power dissipation of the device is varied over time. The term "thermal mass" is sometimes defined as only the total heat capacity, e.g. in J/° C., of a mass. When talking about a server, it is not only this (potential) heat capacity which is important, but also how "accessible" this heat capacity is to the airstream passing through the server. We use "idealized thermal mass" to include all of the server characteristics which can affect the internal and exhaust temperatures of servers when subjected to time-varying inlet temperatures, internal power dissipation, or airflow rate.

In various examples described herein, the idealized thermal mass of the data center device (for example a server) is characterized and included in transient numerical models. However, it is appreciated that other equipment in the data center, including cooling units, Power Distribution Units (PDU), and other devices also have thermal mass and may be included in the transient analyses. Once determined, the thermal mass may be incorporated into numerical models for transient analyses including Computational Fluid Dynamics (CFD), Potential Flow Models (PFM), Fast Fluid Dynamics (FFD), aggregate models, compact models in between, or other numerical models. Various examples of numerical models of analyses describing transient scenarios are described in the PCT/US2011/066877 application.

According to various examples, the thermal mass may be of interest to the data center designer or operator who needs to understand how quickly various portions of the data center may heat up during a transient event. For example, the transient event may include a loss (and return) of cooling associated with a power failure, or a loss (and return) of cooling associated with Information Technology (IT) load shifts or virtualization scenarios.

Such an understanding of transient events may allow the data center designer or operator to prepare the data center for potential transient events. For example, the operator or designer may determine what equipment to connect to backup power, how large of an emergency supply of chilled water to maintain, or where to place the most critical servers or applications. Additionally, the ability to quickly and accurately model the effects of thermal mass may help the designer optimize cooler and other infrastructure control systems with respect to energy usage.

It is appreciated that the server racks in a given data center, with each full rack weighing perhaps 2,000-3,000 lbs, result in much thermal mass available to serve as a heat sink following a cooling loss. Previous approaches to modeling transient events have neglected this thermal mass in transient calculations, assuming that the data center power may heat up only the air in the data center. Excluding this aspect from the transient thermal model may result in excessively conservative calculations of temperature. In at least one example, excluding the thermal mass may result in predicting the temperatures to rise much faster than they may rise in reality.

The previous approaches have nevertheless traditionally excluded server idealized thermal mass from data center transient heating calculations, in part because the server "idealized thermal mass" has not been previously defined in such way as to cover all practical examples. In addition, idealized thermal mass may have been excluded because there may not been a straightforward way to measure the "idealized thermal mass" of a server. Further, idealized thermal mass may also have been excluded because modeling servers in sufficient detail in traditional CFD software may result in models that are too large and computationally intensive to be practically solved.

One method for predicting the transient cooling performance of a data center includes a model which assumes that all the air in the data center is at a well-mixed ambient temperature. The well-mixed method can be too simplistic and may cause the user to miss important local details or unnecessarily overdesign the cooling infrastructure. Instead, the methods and systems disclosed herein, define the idealized thermal mass characteristics of a server based on a comprehensive server idealization, and are more practical to implement. In addition, the systems and methods described herein detail specific procedures for experimentally measuring server idealized thermal mass, and further provide a methodology for incorporating the effects of idealized thermal mass into numerical models, such as for example a CFD model, in a compact way which keeps models simple, fast, and practical.

As noted above, although other equipment in the data center, including cooling units, PDU's, and other equipment also have idealized thermal mass, it is appreciated that by sheer mass, servers are generally the largest contributors. Therefore, the analysis described herein focuses on idealized thermal mass of a server. However, it is appreciated that the idealized thermal mass model may include additional or other equipment. In addition, straightforward modeling techniques may already exist to handle other solid objects such as the raised-floor structure, walls, and columns.

According to various embodiments, the number of parameters needed to characterize a server or other data center equipment may depend on the application. Applications described herein include "external heating" and "internal heating." For the external heating application, the ambient air temperature varies over time, but the heat load produced by the server or other data center equipment is substantially uniform over time. For the internal heating application, the heat load produced by the server or other data center equipment varies over time. For both of these applications some information pertaining to the server may be needed and may be obtained from published manufacturer data, measured or estimated based on available information, including, in one example, server airflow rate, mass of the server, and specific heat of the server or other data center equipment.

For external heating of a server, only one additional parameter is needed beyond the server airflow rate, mass, and specific heat. One instance of the external heating example may include a cooling-power failure scenario, which may drive the design of several aspects of the data center architecture. For example, a data center operator may like to know how long it takes each rack in a data center to reach some maximum acceptable temperature subject to a specific cooling-failure event. According to some examples, a few more minutes of runtime afforded by server idealized thermal mass can make a large difference in capital expense, data center reliability, and operator confidence. For internal heating, yet another parameter may be needed to characterize the position of the heat source relative to the server mass. A practical example for the idealized thermal mass model may include server startup and shutdown and load migration due to virtualization.

Server Idealization

According to various examples described herein, two server idealizations can be used to determine idealized thermal mass: a single and a double-mass model. According to one example, the single-mass model can be used to capture the effects of idealized thermal mass in external heating examples. As described above, when the server is modeled to operate at substantially uniform power dissipation, while the external environment (server inlet) temperature changes.

Single-Mass Server Model

Figure 3A:
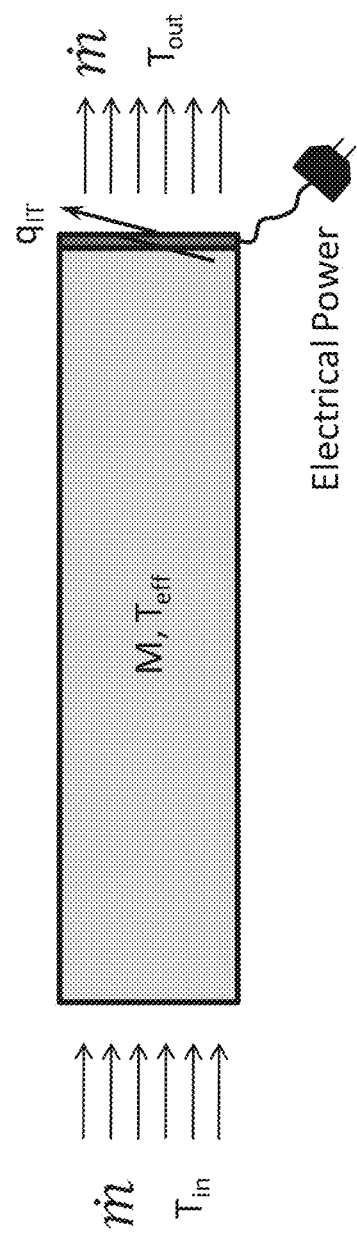
FIG. 3A is a schematic of an example of equipment in a data center that can be analyzed in accordance with at least one example.

Some embodiments analyze the server as a single-mass, as illustrated in FIG. 3A. According to these embodiments, the model of the one-dimensional server is idealized. In these embodiments, the total server mass, M, is located upstream of the server's total heat dissipation $q_{IT}$ which is added to the airstream $\dot{m}$ just upstream of rear of the server. In the single mass idealization, the mass M is at a uniform temperature $T_{eff}$ and is distributed throughout the server volume such that it exchanges heat with the airstream through an area A and a heat transfer coefficient h.

An instantaneous energy balance of the entire server yields:

$$\dot{m}c_p T_{in} + q_{IT} = \dot{m}c_p T_{out} + (Mc_p)_{eff} \frac{dT_{eff}}{dt} \quad \text{Equation (1)}$$

where $(Mc_p)_{eff}$ is the product of the mass and specific heat of the server and $\dot{m}c_p$ is the product of the air mass flow rate and specific heat. Embedded in Equation (1) is an assumption that the thermal mass of the air instantaneously located within the server and heat transfer through the sides of the server to the ambient are negligible compared with the other terms in the model.

An instantaneous energy balance on just the mass M itself yields:

$$(Mc_p)_{eff} \frac{dT_{eff}}{dt} = hA(T_{in} - T_{eff}) \quad \text{Equation (2)}$$

where we have assumed, for simplicity and decreased computational overhead, that all of the convective heat transfer from the air occurs at a single temperature $T_{in}$. If $T_{in}$ were known as function of time than it may be possible in some cases (e.g., a linear increase) to solve Equations (1) and (2) analytically. Regardless, the arbitrary variations in $T_{in}$ are accounted for by creating a discretized model which is also convenient for numerical models. We approximate the temperature derivative as follows:

$$\frac{dT_{eff}}{dt} = \frac{T_{eff} - T_{eff}^{old}}{\Delta t} \quad \text{Equation (3)}$$

where $T_{eff}^{old}$ is the $T_{eff}$ from the previous time step. Solving Equations 1-2 and utilizing Equation 3 yields:

$$T_{eff} = \left(\frac{\tau_1}{\tau_1 + \Delta t}\right) T_{eff}^{old} + \left(\frac{\Delta t}{\tau_2 + \Delta t}\right) T_{in} \text{ and} \quad \text{Equation (4)}$$

$$T_{out} = T_{in} + \Delta T_{IT} + \left(\frac{\tau_2}{\tau_1 + \Delta t}\right)[T_{eff}^{old} - T_{amb}] \text{ where} \quad \text{Equation (5)}$$

$$\tau_1 \equiv \text{Server Thermal Time Constant 1} = \frac{Mc_{p_{eff}}}{hA} \text{ and} \quad \text{Equation (6)}$$

$$\tau_2 \equiv \text{Server Thermal Time Constant 2} = \frac{Mc_{p_{eff}}}{\dot{m}c_p} \quad \text{Equation (7)}$$

Equations (4-7) may then be used to estimate the server's effective and exhaust temperature at each time step in the analysis. The server thermal time constant which emerges from the above analysis characterizes the time scale over which transient heating or cooling of the server takes place. For example, a large time constant implies a very large thermal mass or slow heat exchange with the airstream, and as a result the effective server temperature will change very slowly over time. As the server thermal time constant approaches zero, the server exhaust temperature will simply be the inlet temperature plus $$\Delta T = \frac{q_{IT}}{\dot{m}c_p}$$

as is normally assumed under steady-state conditions. The time constant $\tau_1$ generally varies with server airflow rate because h in Equation (6) varies with flow rate. However, the rate of change is known to be that h varies with flow rate to the ⅘ power—less than linear—and actual server airflow is often fixed or does not vary by a large amount.

Double-Mass Server Model

Figure 3B:
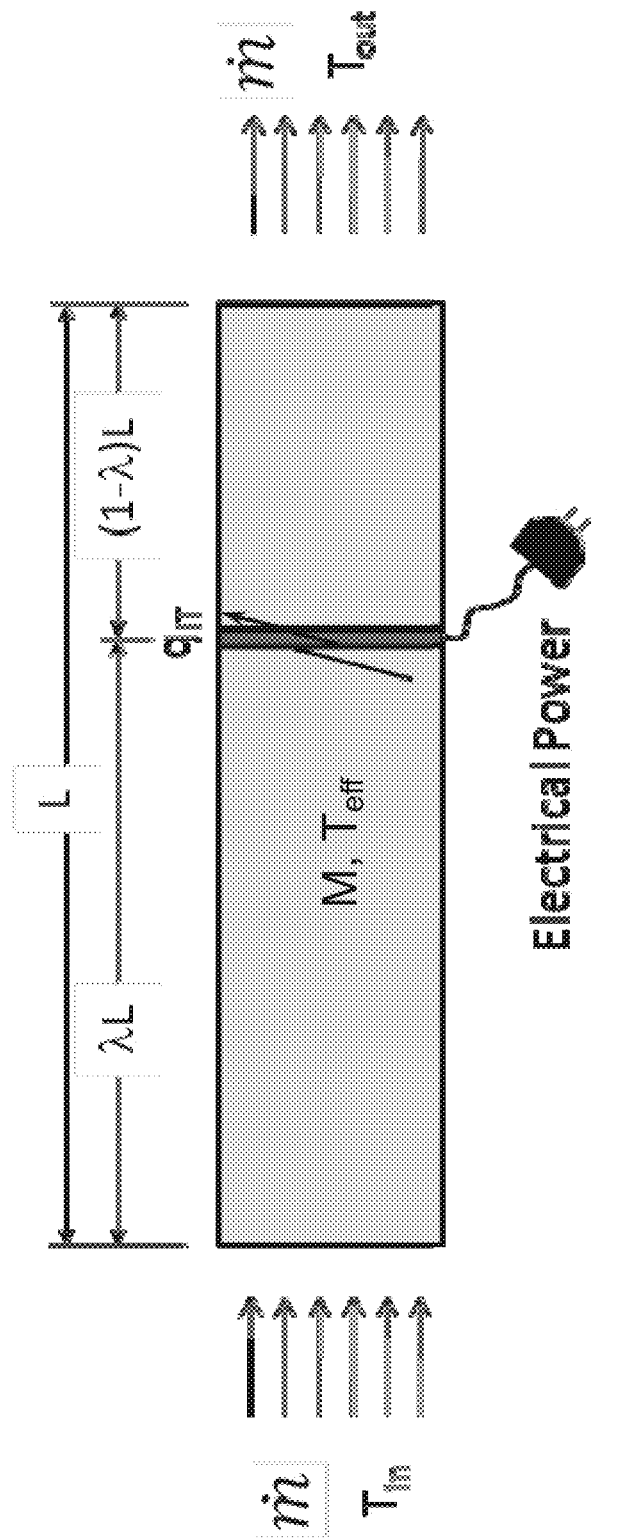
FIG. 3B is a schematic of an example of equipment in a data center that can be analyzed in accordance with at least one example.

To capture the effect of the specific location or distribution of heat-dissipating components inside the server, the server can be modeled as two portions of mass divided by the effect location of the source of internal heating. It is appreciated that the double-mass model may also be used to determine the server's response to a changing ambient temperature, where such information is of interest, or an external heating approach, as described above, may be used. FIG. 3B illustrates a model of a one-dimensional server shown as a double-mass server model. According to various examples, the model of the one-dimensional server is idealized for the purposes of the discussion below. The server, in the illustrated example, has a total mass M and a total heat dissipation $q_{IT}$ which is located a distance $\lambda L$ along the airflow direction of the server. L represents the length of the server volume and $\lambda$ characterizes the position of the heat source relative to the server volume. In one example, the mass M is assumed to be at a uniform temperature $T_{eff}$ and is distributed throughout the server volume such that it exchanges heat with the airstream through a total area A and a heat transfer coefficient h. For the idealized server, the thermal conductivity may be characterized to be relatively high.

An instantaneous energy balance of the entire server can be expressed as:

$$q_{IT} = Mc_{p_{eff}} \frac{dT_{eff}}{dt} + \dot{m}c_p(T_{out} - T_{in}) \quad \text{Equation (8)}$$

where M is the server mass;
$c_{p_{eff}}$ is the overall effective specific heat of the server; and
$\dot{m}c_p$ is the product of the air mass flow rate and specific heat.

Included in Equation (8) is an assumption that the thermal mass of the air instantaneously located within the server and heat transfer through the sides of the server to the ambient temperature are negligible compared with the other terms in the model.

An instantaneous energy balance on just the solid mass M inside the server and excluding the heat source may be expressed as:

$$Mc_{P_{eff}} \frac{dT_{eff}}{dt} = hA_1(T_{in} - T_{eff}) + hA_2\left(T_{in} + \frac{q_{IT}}{\dot{m}c_p} - T_{eff}\right) \quad \text{Equation (9)}$$

where it is assumed that all of the convective heat transfer to/from the air occurs at uniform air temperatures of $T_{in}$ and $$T_{in} + \frac{q_{IT}}{\dot{m}c_p}$$

represents upstream and downstream of the heat source respectively. In the idealized thermal mass represented by Equation (9), the solid mass M can be represented as a uniformly distributed porous media including area $A_1$ disposed prior to the heat source and area $A_2$ disposed after the heat source.

According to some examples, if $T_{in}$ is known as function of time, then it may be possible, in some cases (e.g., a linear increase), to determine idealized thermal mass by solving Equations 8 and 9 analytically. In other examples, arbitrary transient variations in $T_{in}$ (and other parameters) can be accounted for by creating a discretized model. The discretized model may include one or more time steps expressed in units of time. The discretized model may be appropriate for incorporation into numerical models of an entire data center. In one example, the temperature derivative can be expressed as follows:

$$\frac{dT_{eff}}{dt} = \frac{T_{eff} - T_{eff}^{old}}{\Delta t} \quad \text{Equation (10)}$$

where $T_{eff}^{old}$ is the $T_{eff}$ from the previous time step. Solving Equations (8-9) and utilizing Equation (10) results in server effective temperature and server exhaust temperature may be expressed as:

$$T_{eff} = \left(\frac{\tau_1}{\tau_2 + \Delta t}\right) T_{eff}^{old} + \left(\frac{\Delta t}{\tau_1 + \Delta t}\right)[T_{in} + (1-\lambda)\Delta T_{IT}] \text{ and} \quad \text{Equation (11)}$$

$$T_{out} = \quad \text{Equation (12)}$$
$$T_{in} + \Delta T_{IT} + \left(\frac{\tau_2}{\tau_1 + \Delta t}\right)[T_{eff}^{old} - T_{in} - (1-\lambda)\Delta T_{IT}] \text{ where}$$

$$\tau_1 \equiv \text{Server Thermal Time Constant 1} = \frac{Mc_{P_{eff}}}{hA} \quad \text{Equation (13)}$$

$$\tau_2 \equiv \text{Server Thermal Time Constant 2} = \frac{Mc_{P_{eff}}}{\dot{m}c_p} \quad \text{Equation (14)}$$

$$\Delta T_{IT} \equiv \text{Steady State Server Temperature Rise} = \frac{q_{IT}}{\dot{m}c_p} \quad \text{Equation (15)}$$

In one example, the steady-state (or pre-transient event period) starting temperatures may be expressed as:

$$T_{eff}^0 = T_{in}^0 + (1-\lambda)\Delta T_{IT}^0 \quad \text{Equation (16)}$$

$$T_{out}^0 = T_{in}^0 + \Delta T_{IT}^0 \quad \text{Equation (17)}$$

Equations (11-12) may then be used to estimate the server's effective and exhaust temperature at each time step in the transient analysis. The server thermal time constants, which emerge from the above analysis, may characterize the time scale over which transient heating or cooling of the server takes place. For example, large time constants imply that the effective server temperature can change slowly over time. In the above examples, as the server thermal time constants approach zero, the server exhaust temperature becomes simply the inlet temperature plus steady state temperate difference, $\Delta T_{IT}$, as expected under steady-state conditions.

The time constant $\tau_1$ generally may vary with server airflow rate, because h in Equation (13) varies with flow rate. However, the rate of change is known to be that h, varies with flow rate to the ⅘ power—less than linear—and actual server airflow is often fixed or does not vary by a large amount. The time constant $\tau_2$ may also vary inversely with flow rate as seen from Equation (14).

In the analytical model described by Equations (11-12), according to some examples, time constant, $\tau_2$, and steady state temperature difference, $\Delta T_{IT}$, may be regarded as known quantities. For example, mass of a server may be determined, $c_{P_{eff}}$ can be estimated based on a known server composition. According to some examples, mass and $c_{P_{eff}}$ can be determined and estimated using data published by the server manufacturer or through a "server autopsy" (e.g. by analyzing the individual server). Server power and airflow rate may also be assumed as known as both can be determined, measured or estimated using available data. With $\Delta t$ a somewhat arbitrary time step used in the numerical analysis, the remaining unknowns include the time constant $\tau_1$ and $\lambda$.

Further, when the server temperature difference, $\Delta T_{IT}$ remains constant over time (and the only transient effects come from external ambient temperature changes), the model described by Equations (11-12) can be shown to be independent of $\lambda$ (i.e. the location of the heat source) making time constant $\tau_1$ the sole remaining unknown. Although a detailed proof showing when $\lambda$ drops out of Equations (11-12) is not described herein, the physical reason for this behavior is as follows. While the temperature difference between the air and the thermal mass is larger by an amount of server temperature rise $\Delta T_{IT}$ downstream of the heat source, the overall thermal mass temperature also decreases as the heat source is moved toward the rear of the server. This increase in thermal mass temperature offsets the higher air temperatures such that the server outlet temperature predicted by Equation (12) is the same regardless of the value of $\lambda$. In some examples, when the server power or airflow (reflected in $\Delta T_{IT}$) varies over time, the position of the heat source does affect outlet temperature. In the one case of $\lambda=1$, $T_{out}$ simply "floats" with the changing $\Delta T_{IT}$ as there is no thermal mass downstream of the heat source to absorb or dampen the changes.

Thermal Effectiveness in the Models

The time constant $\tau_1$ in both models may also be difficult to estimate for a user without detailed experimental data because it is a dimensional quantity (e.g., in seconds). In these embodiments, not all values of $\tau_1$ are physically sensible based on Second-Law-of-Thermodynamics considerations. Hence, in the embodiments described below, a server thermal effectiveness $\epsilon$ is described as an alternative to the time constant, $\tau_1$. Similar to the single-mass model, the server thermal effectiveness for the double-mass model is a dimensionless number between zero and one, with the maximum possible heat transfer, between the airstream and the server mass, occurring at $\epsilon=1$ and while zero heat is transferred when $\epsilon=0$.

Referring again to FIG. 3B, consider the maximum heat transfer that can occur between the air stream and the thermal mass with no internal heating. From the Second Law of Thermodynamics, $T_{out}$ can never be cooled below or heated above $T_{eff}$ but may approach this value under extreme conditions. Therefore, based on this principle, the server thermal effectiveness can be expressed as:

$$\varepsilon \equiv ServerThermalEffectiveness = \frac{q}{q_{max}} = \frac{T_{in} - T_{out}}{T_{in} - T_{eff}} \quad \text{Equation (18)}$$

which clearly varies between zero and one. Equation (18) can be rewritten as:

$$T_{out} = T_{in} + \epsilon(T_{eff} - T_{in}) \quad \text{Equation (19)}$$

To compare the definition of $\epsilon$ with our previously-derived equations, $T_{eff}^{old}$ can be solved for in Equation (11) and substituted into Equation (12) (with $\Delta T_{IT}=0$), resulting in the server exhaust temperature expressed as:

$$T_{out} = T_{in} + \frac{\tau_2}{\tau_1}(T_{eff} - T_{in}) \quad \text{Equation (20)}$$

Comparing Equations (19) and (20) can result in the server thermal effectiveness expressed as:

$$\epsilon = \frac{\tau_2}{\tau_1} = \frac{hA}{\dot{m}c_p} \quad \text{Equation (21)}$$

As noted above, the value of the server thermal effectiveness $\epsilon$ can include any value between 0 and 1 and, with a clear physical interpretation, and it is easier to estimate than $\tau_1$ directly. Further, as long as the server thermal effectiveness $\epsilon$ is assumed to be between 0 and 1, physically sensible input values are assured.

It is appreciated that Equations (11) and (12) can be rewritten in terms of $\epsilon$. However, because the equations are slightly more compact as expressed with $\tau_1$, the Equations (11) and (12) remain expressed in terms of $\tau_1$. Other than the discussion below about capturing user input data, $\tau_1$ is used in the discussions and equations which follow but server input properties can always be restated in terms of $\epsilon$.

Compact Description of Server for Numerical Data Center Models

Figure 4:
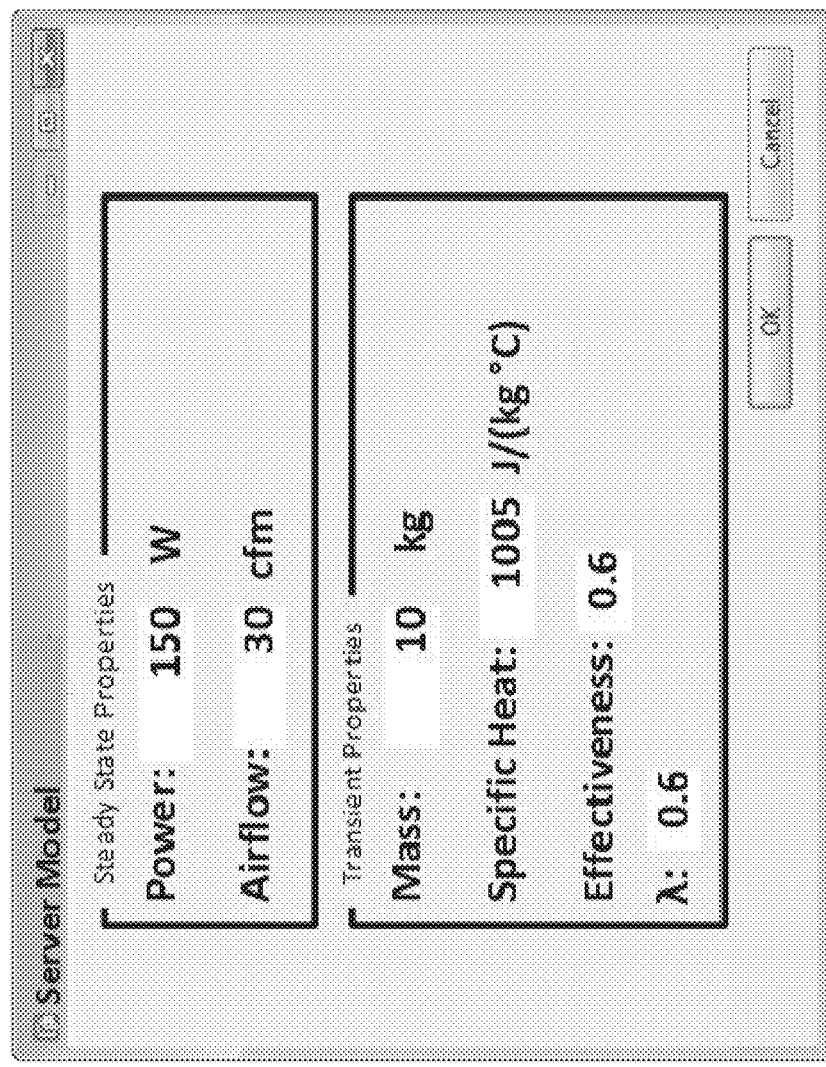
FIG. 4 is a diagram of a user interface in accordance with one example.

FIG. 4 shows one example of a user interface provided for an operator or designer of a data center that includes transient and steady state parameters. To incorporate the idealized thermal mass of a server, into numerical models for transient analyses, the parameters shown in FIG. 4 may be received by the system. As described above, the system may include an airflow solver which may include any full-field-solution type including CFD, PFM, FFD, aggregate models, or compact models in between, including other airflow-determining solutions.

In some examples, the parameters may be prompted to be entered by the user. In other examples, the steady state parameters may be otherwise received by the system, for example, by receiving measured data from the data center.

As illustrated, the steady state parameters may include power and airflow. The additional parameters that need to be prompted to be input by the user for the transient model (above and beyond those required for the steady-state analysis) may include the server mass, specific heat, effectiveness $\epsilon$, and $\lambda$. In addition, it is assumed that the specific heat and density of air are also values known by the system.

In some cases, not all of the transient parameters shown in FIG. 4 may be prompted for the user to enter. In one example, only the mass can be entered by the user while server specific heat, effectiveness and $\lambda$ values can be assumed. For example, the specific heat, thermal effectiveness and $\lambda$ may be assumed based on typical values for a data center. In these embodiments, the user may be prompted to input only the easiest to determine information and yet be able to capture the effects of idealized thermal mass to a reasonable approximation.

According to various embodiments, with the received input data shown in FIG. 4, other required parameters may be computed. For example, the air mass flow rate $\dot{m}$ may be computed as the product of the volumetric flow rate and the density. In addition, $\tau_1$ may be computed in terms of time constant $\tau_2$ and server effectiveness, and expressed as $\tau_2/\epsilon$.

Figure 5:
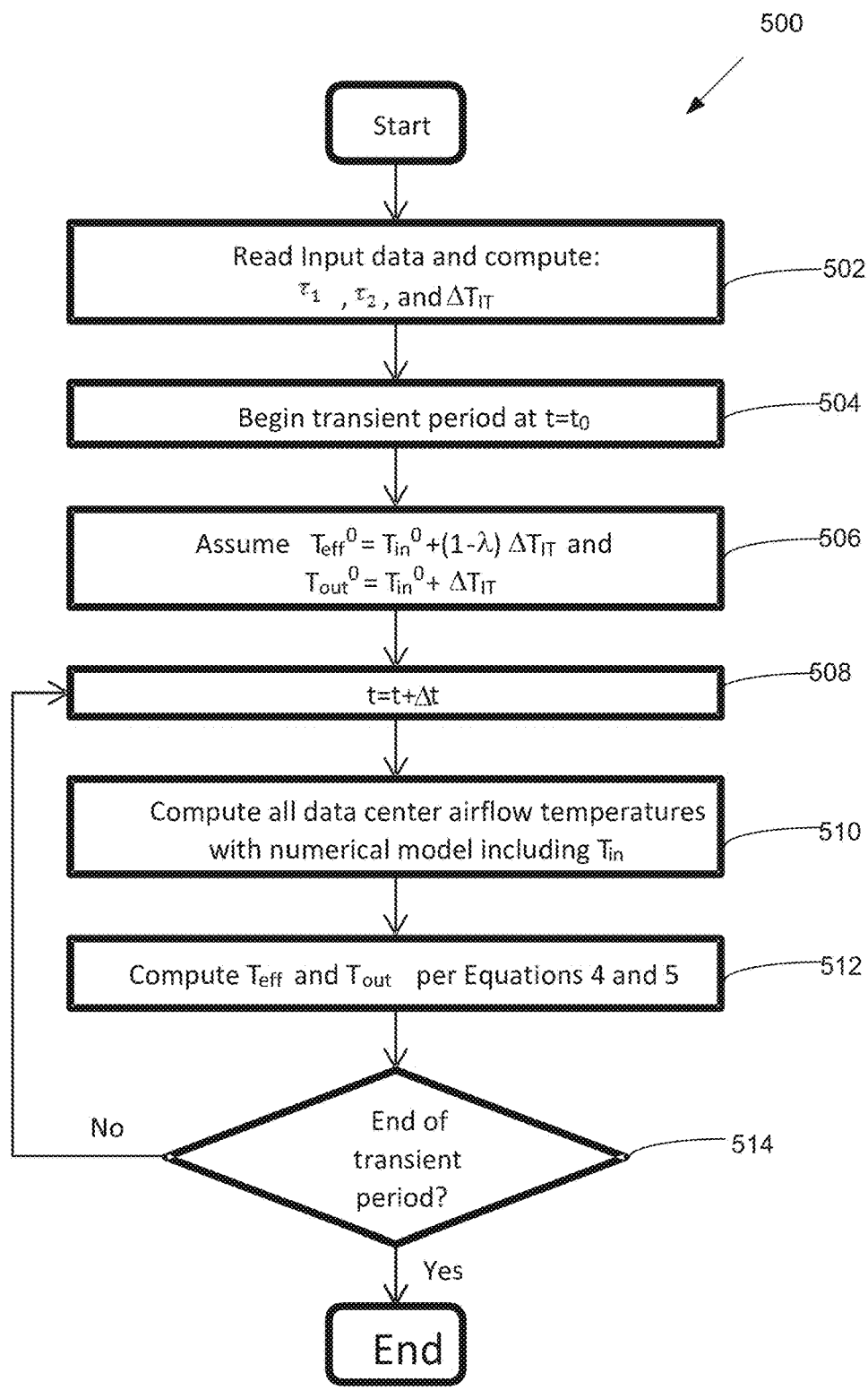
FIG. 5 is a flowchart of a process in accordance with one example.

In these embodiments, with all parameters known, the model expressed by Equations (11-12) may be used to compute server outlet temperatures as functions of time. The temperature of each server mass at the beginning of the transient period is given by Equation (16). As the transient analysis progresses, the server outlet temperature is updated at every time step which, in turn, impacts temperatures in the data center including, potentially, the inlet temperature of the server itself. As a result of achieving a "converged" solution at a given time step, the time is advanced by one time step and the process continues until the end of the transient period has been reached as summarized in method 500 shown in FIG. 5. In at least one example, the process may end prior to reaching the end of the transient period if a predetermined threshold is reached. For example, the process may end when exhaust temperatures are equal to or greater than maximum allowable temperatures.

In step 502, information is received by the system. In examples described above, the information can be entered by a user or received from the data center and may include airflow and power distribution associated with the server. Based on the information received, time constants $\tau_1$ and $\tau_2$ and server temperature rise $\Delta T_{IT}$ may be determined as described above. In step 504, the transient period begins at steady state, at time=$t_0$. In step 506, the steady-state (or pre-transient event period) starting server effective temperatures and server output temperatures may be expressed by Equation (16) and Equation (17). In step 508, the next time step is considered. In step 510, the airflow solver computes all data center airflow temperatures with a numerical model including input temperatures. In step 512, server effective and server output temperature is updated using Equation (11) and Equation (12). In step 514, the system determines if the end of the transient period has been reached. If so, the method 500 ends. If not, the next time step is considered and method 500 returns to step 508. The process could also be similarly performed with the single-mass method.

In some examples, it is also possible to, at least approximately, account for the variations of $\tau_2$ or $\epsilon$ with airflow rate to increase accuracy. These variations can be determined without additional user input beyond that shown in FIG. 4 if the $\epsilon$ specified is interpreted as corresponding to the airflow rate specified. The heat transfer coefficient h can then be assumed to vary with velocity along with $\dot{m}$ and the effects on $\tau_2$ can be automatically handled. In other embodiments, the model may not include these variations with the airflow rate.

Modeling Entire Racks: Multiple Servers in Parallel

Often, the user of the data center numerical model may want to model an entire rack as one object rather than separately model the multiple servers operating in parallel that populate the rack. The model of Equations (11) and (12) can be used with a proper reinterpretation of the $Mc_{Peff}$, $\tau_1$, and $\lambda$ parameters. The effective rack-level mass $M_{eff}$, power $q_{IT_{eff}}$, and airflow $\dot{m}_{eff}$ (or $Q_{eff}$ on a volumetric basis) are obviously just the sum of their server-level counterparts including the rack itself. The effective specific heat can be computed as a mass-weighted average:

$$c_{P_{eff}} = \frac{1}{M_{eff}} \left( \sum_{s=1}^{n} M_s c_{P_s} + M_R c_{P_R} \right) \quad \text{Equation (22)}$$

where n is the number of servers and the subscript "R" refers to the rack itself. Using the definition of thermal effectiveness, $\epsilon = hA/\dot{m}c_p$, the rack-level effective value can be shown to be:

$$\epsilon_{eff} = \frac{1}{Q_{eff}} \left( \sum_{s=1}^{n} Q_s \epsilon_s + Q_R \epsilon_R \right) = \frac{\sum_{s=1}^{n} Q_s \epsilon_s + Q_R \epsilon_R}{\sum_{s=1}^{n} Q_s + Q_R} \quad \text{Equation (23)}$$

where the airflow rate, $Q_R$, and thermal effectiveness, $\epsilon_R$, of the rack itself are not easily estimated. We might guess that $\epsilon_R$ is similar to that of the servers measured here because of the rack's large heat transfer area. In light of this, we suggest that the racks contribution to thermal effectiveness may be ignored (and $Q_R=0$).

Unfortunately, $\lambda_{eff}$ for the entire rack may, in general, vary with time making its value somewhat limited. As discussed above, A may generally be close to zero for many servers making, $\lambda_{eff}=0$ a reasonable assumption. Based on the analytical example presented above, we suggest that, in the limiting case where all servers have the same time constant $\tau_1 = Mc_p/hA$ and the same rate of internal heating $\Delta T_{IT}(t)$, $\lambda_{eff}$ reduces to a heat-capacity-weighted average of the corresponding server values:

$$\lambda_{eff} = \frac{1}{M_{eff} c_{P_{eff}}} \left( \sum_{s=1}^{n} M_s c_{P_s} \lambda_s \right) \quad \text{Equation (24)}$$

Experimental Measurement of Idealized Thermal Mass

As mentioned above, to determine the $Mc_{Peff}$ and $\tau_1$ idealized thermal mass properties of the server, the server inlet air temperature $T_{in}$ is varied over time. In various examples, to determine the additional parameter $\lambda$, which characterizes the relative distribution of the mass and the heat sources, the server heat load is also varied. While both $T_{in}$ and $\lambda$ parameters can be varied simultaneously, running the experiments separately may make it easier to determine the individual effects of $\lambda$ as distinct from the other parameters.

Figure 6B:
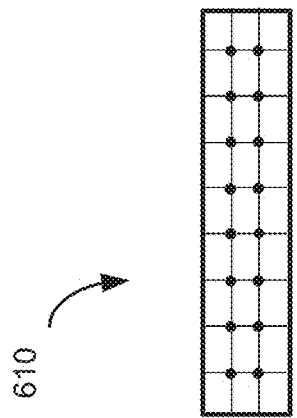
FIG. 6B is a diagram showing an example of a component of the measurement apparatus used in accordance with at least one example.
Figure 6C:
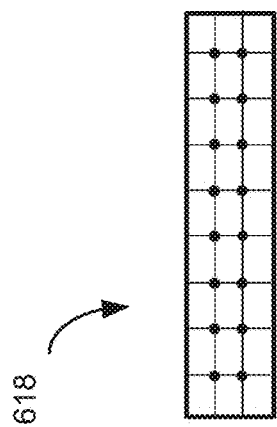
FIG. 6C is a diagram showing an example of a component of the measurement apparatus used in accordance with at least one example.
Figure 6A:
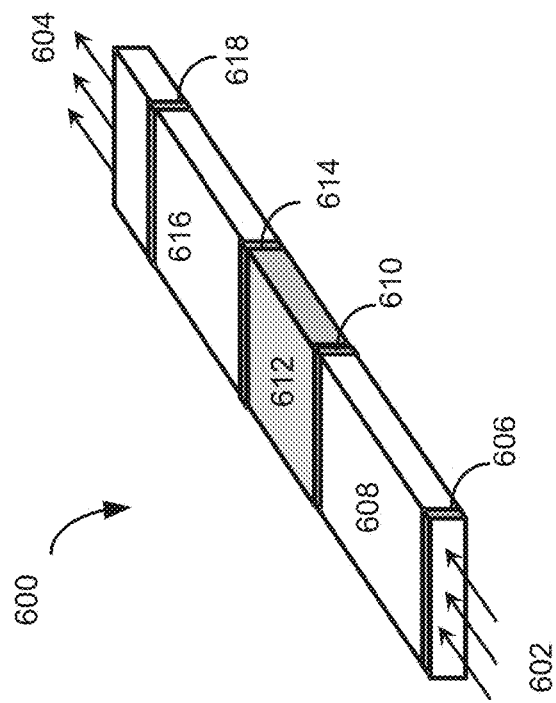
FIG. 6A is a diagram showing an example of a measurement apparatus used in accordance with at least one example.

FIG. 6A illustrates one example of the experimental apparatus 600 that can be used to measure idealized thermal mass properties of the server and determine the effects of the individual parameters that are varied over time. The experimental apparatus 600 includes an inlet duct 608 including a heater section 606, an inlet measurement section 610, a server 612, a flow straightening section 614, an exhaust duct 616, and an exhaust measurement section 618. The inlet air 602, having an inlet temperature, enters the experimental apparatus 600, flows from the inlet duct 608, through the inlet measurement section 610, through the server 612, to the flow straightening section 614, to the exhaust duct 616, and through the exhaust measurement section 618 and exits as exhaust air 604 having an exhaust temperature. In one example, the apparatus may be semi-permanently installed in a laboratory setting. In other examples, the apparatus may be tightly integrated and portable making it easy to perform measurements in remote locations.

According to some examples, the inlet duct 608 includes the heater section 606, which may include resistive heating coils or any other suitable heat source. The inlet temperature to the server may be controllable such that the temperature can be varied several degrees over a time period. In one example, the temperature can be varied approximately 20-30° C. over a period of a few minutes. However, it is appreciated that the inlet temperature may be approximate, and need not be controllable to a specific temperature profile or even be very repeatable. Other temperatures and time periods are contemplated. In some examples, the heater section may be physically separate from the inlet duct 608.

FIG. 6B illustrates the inlet measurement section 610 in greater detail. In the illustrated example, the inlet measurement section 610 includes a hot wire anemometer configured to measure velocity and temperature of the air prior to entering the server 612. However, the inlet air velocity and temperature may be measured by other mechanisms. In various examples, because inlet airflow 602 is generally much more uniform than exhaust airflow 604, velocity measurements by the inlet measurement section 610 may be more reliable than at the exhaust measurement section 618 for purposes of computing total server airflow rate.

As illustrated in FIG. 6A, the flow-straightening section 614 is included at the server 612 exhaust and prior to the exhaust duct 616. In one example, the flow-straightening section 614 is configured to smooth out the velocity and temperature distribution prior to the air flow reaching the exhaust measurement section 618 and significant duct length, before and after the measurement location helps achieve smooth airflow in this area. It is appreciated that the flow-straightening section 610 may be optional.

FIG. 6C illustrates the exhaust measurement section 618 in greater detail. The exhaust measurement section 618 may also include hot wire anemometers or other means for measuring velocity and temperature. In some examples, other equipment includes a measurement system for measuring server power and a data acquisition system for recording temperatures over time. Velocity measurements acquired by the inlet measurement section 610 and the exhaust measurement section 618 can be integrated with temperature measurements as shown in FIG. 6A. Alternatively, the velocity measurement can be made separately with a hand-held hot-wire anemometer or other means.

In various embodiments, the apparatus 600 can be used to determine inlet and exhaust temperatures. In at least some embodiments, an important step in measuring the server idealized thermal mass is ensuring that the exhaust temperatures are correctly weighted such that a steady-state energy balance is strictly enforced. In other words, the measured steady-state temperature difference across the server must agree with:

$$\Delta T_{steady} = T_{out} - T_{in} = \frac{q_{IT}}{\dot{m}c_p} \quad \text{Equation (25)}$$

where all parameters (except the known specific heat of air, $c_p$) are measured by the apparatus 600. With $\Delta T_{steady} = q_{IT}/\dot{m}c_p$ "correct" at steady state, transient testing can isolate the transient term in Equation (12):

$$\Delta T_{transient} = \left(\frac{\tau_2}{\tau_1 + \Delta t}\right)(T_{eff}^{old} - T_{in}) \quad \text{Equation (26)}$$

Further, to ensure the correct $\Delta T_{steady}$, the air mass flow rate $\dot{m}$ may be calculated based on the more reliable inlet-duct velocity measurements measured by the inlet measurement section 610. The temperature measurements may be weighted at the exhaust to account for the fact that the airflow rate at each measurement location may not be constant. The temperature and velocity measurements are weighed as follows:

$$T_{out} = \alpha \frac{\sum_{i=1}^{n} V_i T_i}{\sum_{i=1}^{n} V_i} \quad \text{Equation (27)}$$

where the summed $V_i$ are the measured velocities and the balancing $\alpha$ is an additional weighting parameter used to empirically correct for measurement errors. The balancing parameter $\alpha$ s simply chosen to adjust the right hand side of Equation (33) to match the steady-state $T_{ex}^0$ of Equation (17).

Figure 7:
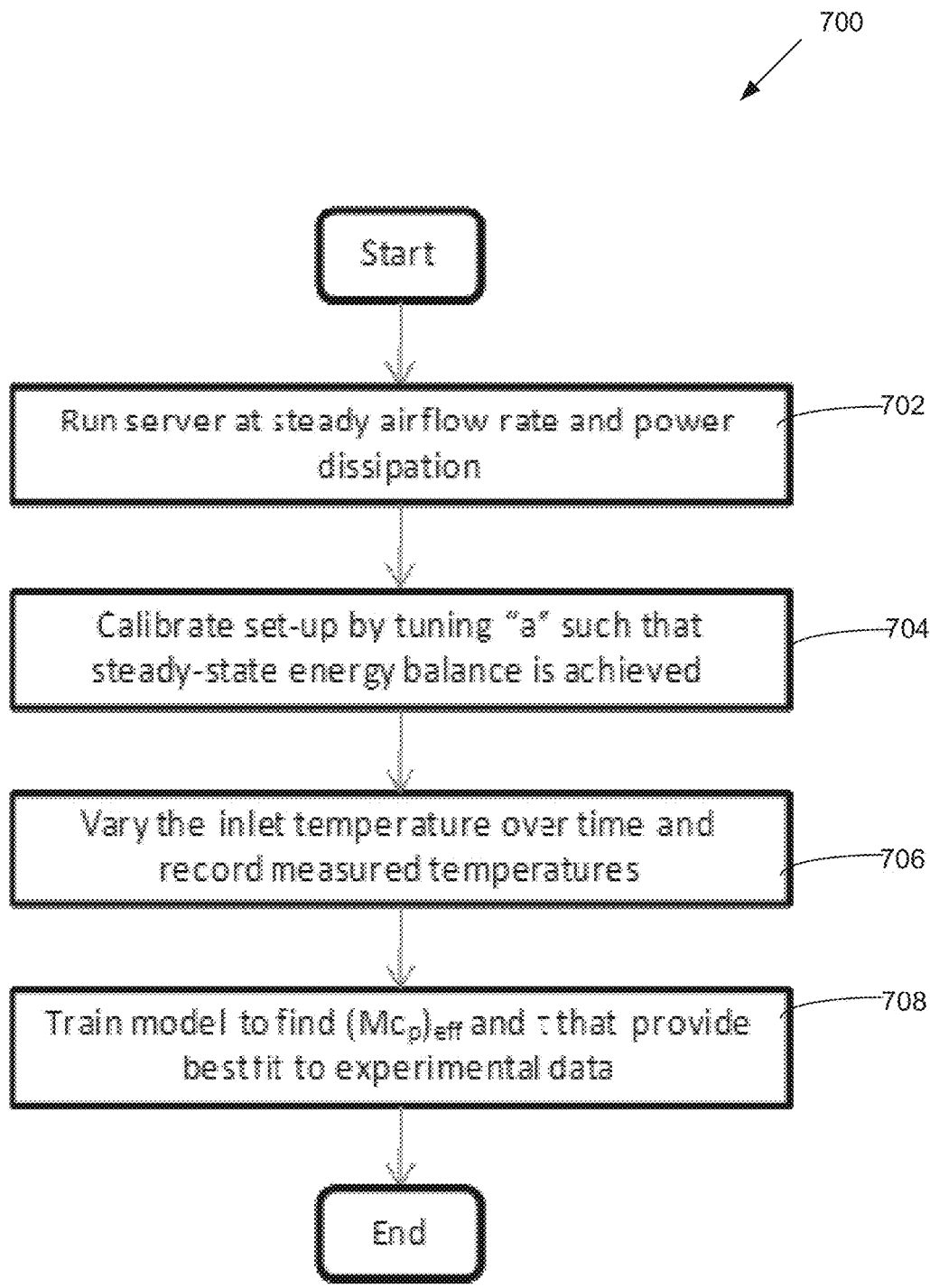
FIG. 7 is a flowchart of a process in accordance with one example.

According to various embodiments, effective specific heat of the server mass $Mc_{Peff}$ and the time constant $\tau_1$ are first experimentally measured using the apparatus 600 according to method 700 illustrated in FIG. 7. In another embodiment, $Mc_{Peff}$ can be determined without experimentation by weighing the server to find the mass and performing a component-by-component analysis to determine the specific heat. In this case, only the time constant $\tau_1$ would be manipulated to find a fit of the model to the experimental data. Method 700 may be used to determine temperatures in an external heating example, for example in a cooling-power failure scenario. In step 702, the server 612 may be set to run at a steady power dissipation and steady airflow rate. In one example, steady power dissipation and steady airflow rate can be achieved by using software which places a constant dummy load on the processor of the server 612. As many servers automatically increase their airflow rate in response to an excessively warm ambient, it may be beneficial to start at the constant airflow rate. Not only is a constant flow rate more convenient for the experiment, but it also may be more appropriate for the data center power-failure scenario for which determining the server idealized thermal mass is significant. It is appreciated that the maximum airflow rate in most servers can be easily realized by removing fan tachometer wires or by tripping a switch which senses if the cover has been removed.

In step 704, the apparatus 600 may be calibrated until the energy balance of Equation (38) is satisfied by varying the balancing parameter $\alpha$ of Equation (27). In step 706, starting from the calibrated steady-state condition, the inlet temperature may be varied over a period of time, for example several minutes. In one example, the inlet temperature may be heated to vary over time. In step 708, the data is then analyzed and the time constant $\tau_1$ which provides the best fit to the analytical model of Equations (11-12) is determined.

Figure 8:
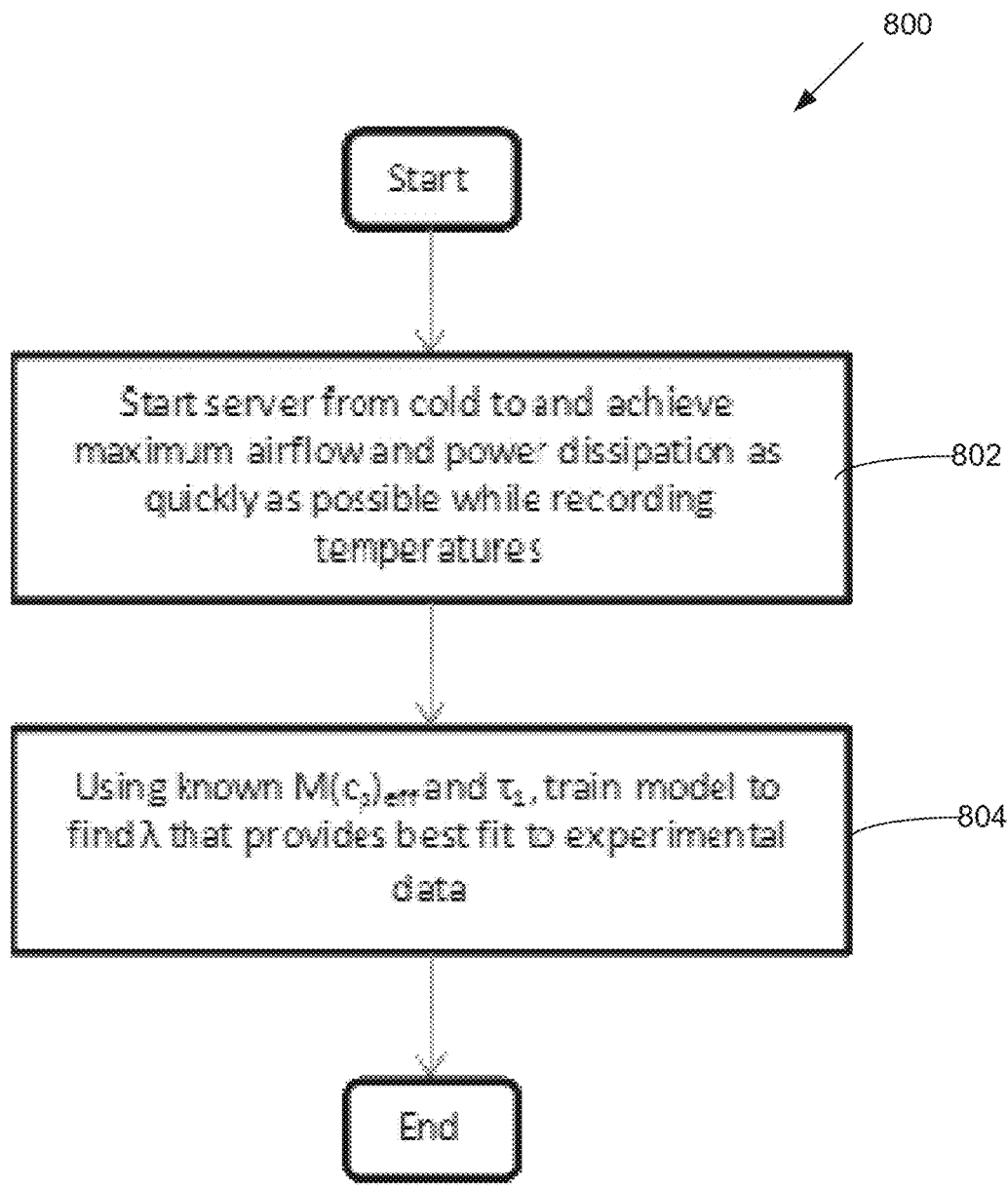
FIG. 8 is a flowchart of a process in accordance with one example.

Method 800 illustrated in FIG. 8 may be used to model a server's response in an internal heating scenario. Specifically, the method 800 may be used to determine the effective position of the heat source relative to the server mass $\lambda$, using a second set of measurements. In step 802, the server is started from cold conditions with the server airflow and power ramping up to maximum as quickly as possible. (This rapid ramping of power and airflow models the server's response during startup, shutdown and load migration due to virtualization.) In step 804, using the $Mc_{Peff}$ and $\tau_1$ determined using method 700 described above, the value for $\lambda$ is found which provides the best fit of the analytical model of Equations (11-12) to experimental data.

It is appreciated that if a large number of servers are to be characterized using the apparatus 600 and methods 700 and 800, it may be more convenient to test many servers of a given size (e.g., 1 U, 2 U, etc.) consecutively so that the apparatus can be reused with minimal modifications. Measurement ducts need not be made for every server size as nozzle/diffuser adapters could be used to, say, transition a 1 U duct to a 2 U server, or a 6 U duct to a 5 U server. With this approach it would be possible to cover the entire practical range of servers from 1 U to about 10 U with perhaps 3 experimental set-ups.

With the measurement apparatus such as the one shown in FIG. 6A, it is fairly easy to characterize many servers and/or each server under multiple conditions such as several alternative airflow rates. Characterizing multiple servers, may allow for a creation of a virtual library of server profiles, each server profile including multiple properties. Such a virtual library may facilitate the convenient modeling of transient events such as a loss (and return) of cooling associated with a power failure, or a loss (and return) of cooling associated with an IT load shift and further optimize cooler and other infrastructure control systems with respect to energy usage.

Example Server Idealized Thermal Mass Characterization

As an example, a Dell R200 1 U 2-CPU server 612 is considered. In this example, the server weighs 9.0 kg. Based on available data, the effective heat capacity is estimated as 768 J/(kg° C.). Running under steady conditions with processor loading set at 100% and the fan tachometer wire removed to produce maximum airflow, the server dissipates 99 W and moves 30.3 cfm of airflow as measured in the inlet duct 608. The test apparatus 600 utilized a small personal-style 1500 W heater to produce the increasing external temperature. In this example, three thermocouples were placed at the inlet duct 608 and eight thermocouples were placed in the exhaust duct 616. In one example, a hand-held anemometer, instead of the inlet and exhaust measurement section 610 and 614 was used to provide velocity measurements.

Figure 9:
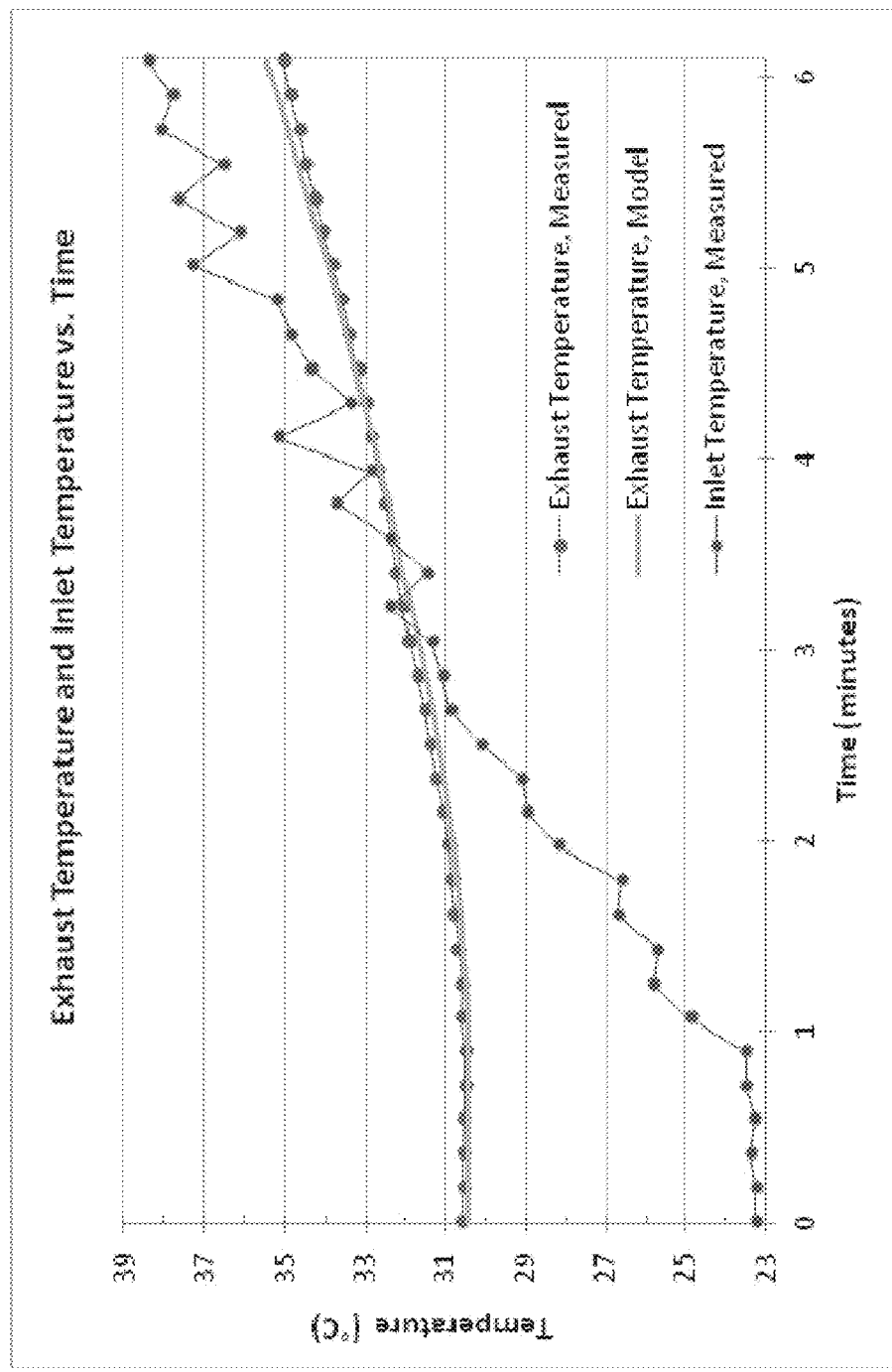
FIG. 9 is a graph comparing the results of at least one process in accordance with one example.

FIG. 9 may demonstrate the resulting temperatures in a center power-failure scenario described above with reference to method 700. The numerical model may be calibrated by setting the balancing parameter $\alpha = 1.00239$ in order to provide the required energy balance at steady-state conditions, $\Delta T_{steady} = q_{IT}/\dot{m}c_p$. With the model calibrated, the heater was turned on in such a way as to produce the inlet temperature profile shown in FIG. 9. FIG. 9 illustrates measured exhaust temperatures and inlet temperatures and resulting modeled exhaust temperatures versus time. A value of $\tau_1 = 400$ seconds provided the best fit of the model to the measured data. From these values, other parameters can be computed if desired: hA=17.25 W/° C. and ϵ=0.64.

Figure 10:
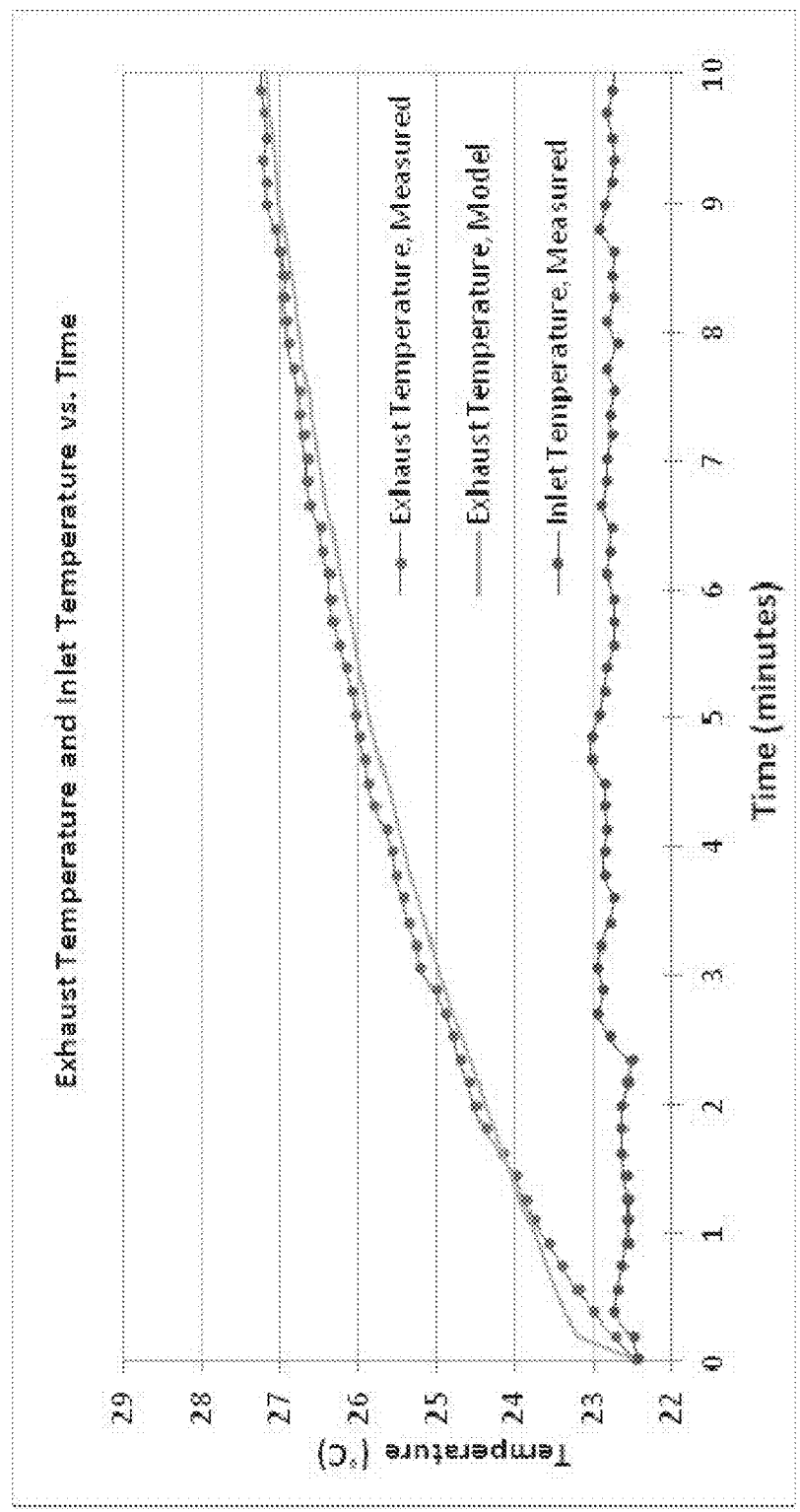
FIG. 10 is a graph comparing the results of at least one process in accordance with one example.

FIG. 10 illustrates the rapid ramping of power and airflow aimed at determining the server's response to self-heating as described with reference to method 800. The server may be turned on from a complete shutdown at room temperature with no ambient heat source and the response to its self-heating is recorded. Using the $\tau_1$ value found previously, $\lambda$ is varied until the analytical model matches the experimental data. FIG. 10 illustrates the fit between the measured exhaust temperature curve and the curve generated by the theoretical model using $\lambda$=0.10 versus time. In the illustrated example, the small value of $\lambda$ indicates that the majority of the server's effective thermal mass is "behind" the heat source. The server's idealized thermal mass characteristics are summarized in Table 1.

TABLE 1

Idealized thermal mass Summary for Example Server

Dell R200 2-CPU 1U Server

| | |
|---|---|
| Airflow Rate (cfm) | 30.3 |
| M (kg) | 9 |
| Cp (J/(kg ° C.)) | 768 |
| ϵ | 0.64 |
| $\lambda$ | 0.1 |

In embodiments above, processes and systems are provided that can determine idealized thermal mass and relevant temperatures in a data center. The systems and methods can be used to provide optimized design of a data center by using results of the systems and methods to change the actual layout of equipment or the proposed layout of equipment. In processes described above, values related to data center cooling, including air flows and temperatures are determined. As readily understood by one of ordinary skill in the art, in at least some embodiments, the values determined are predictions for actual values that will occur in a data center having the parameters modeled. In methods of at least one embodiment, after successful modeling of servers and racks in a data center, the results of the model may be used as part of a system to order equipment, ship equipment and install equipment in a data center as per the designed layout.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for evaluating cooling performance in a data center, the method comprising:
receiving at least one measured steady state parameter of the data center;
receiving parameters for equipment in the data center, the parameters including information descriptive of mass of the equipment;
calculating an effective temperature associated with the equipment and an exhaust temperature of the equipment at a first time period of a plurality of time periods based on the at least one measured steady state parameter and the received parameters;
calculating an effective temperature and an exhaust temperature for each subsequent time period of the plurality of time periods based on the at least one measured steady state parameter, the received parameters, and the effective temperature and the exhaust temperature at a previous time period of the plurality of time periods; and
controlling at least one of a cooler and an infrastructure system based on at least one of the calculated subsequent effective temperature and exhaust temperatures.

2. The method of claim 1, wherein receiving the parameters for the equipment includes receiving information descriptive of at least one of a server and an equipment rack.

3. The method of claim 1, wherein receiving the parameters includes receiving, via a user interface, information descriptive of at least one of an input temperature, a power dissipation, an airflow, a specific heat, a thermal effectiveness, and a position of an effective heat source relative to the mass.

4. The method of claim 3, further comprising providing default values for the parameters via the user interface, the default values being predetermined measurements of at least one of a thermal effectiveness of the equipment and a position of an effective heat source relative to the mass of the equipment.

5. The method of claim 1, wherein calculating the effective temperature and the exhaust temperature at the first time period comprises calculating the effective temperature and the exhaust temperature based on internal heat transfer characteristics through the equipment and physical thermal properties of the equipment.

6. The method of claim 5, wherein calculating the effective temperature and the exhaust temperature based on internal heat transfer characteristics through the equipment includes calculating the effective temperature and the exhaust temperature based on at least one of a heat transfer coefficient of the equipment, an amount of surface area of contact between airflow and the equipment, a thermal effectiveness of the equipment, a time constant of the equipment, a specific heat of air, an airflow rate, and a position of an effective heat source relative to the mass of the equipment.

7. The method of claim 5, wherein calculating the effective temperature and the exhaust temperature based on the physical thermal properties of the equipment includes calculating the effective temperature and the exhaust temperature based on at least one of a specific heat of the equipment and the mass of the equipment.

8. A system for evaluating equipment in a data center, the system comprising:
an interface configured to receive at least one measured steady state parameter of the data center and to receive parameters for the equipment in the data center, including information relating to mass of the equipment; and
a controller coupled to the interface and configured to:
calculate an effective temperature associated with the equipment and an exhaust temperature of the equipment at a first time period of a plurality of time periods based on the the at least one measured steady state parameter and the received parameters;
calculate an effective temperature and an exhaust temperature for each subsequent time period of the plurality of time periods based on the at least one measured steady state parameter, the received parameters, and the effective temperature and the exhaust temperature at a previous time period of the plurality of time periods; and control at least one of a cooler and an infrastructure system based on at least one of the calculated subsequent effective and exhaust temperatures.

9. The system of claim 8, wherein the equipment comprises at least one of a server and an equipment rack.

10. The system of claim 8, wherein the interface is configured to receive the parameters by receiving information descriptive of at least one of an input temperature, a power dissipation, an airflow, a specific heat, a thermal effectiveness, and a position of an effective heat source relative to the mass.

11. The system of claim 10, wherein the interface is further configured to provide default values for the parameters, the default values being predetermined measurements of at least one of a thermal effectiveness of the equipment and a position of an effective heat source relative to the mass of the equipment.

12. The system of claim 8, wherein the controller is further configured to calculate the effective temperature and the exhaust temperature at the first time period based on internal heat transfer characteristics through the equipment and physical thermal properties of the equipment.

13. The system of claim 12, wherein the controller is configured to calculate the effective temperature and the exhaust temperature based on internal heat transfer characteristics through the equipment by calculating the effective temperature and the exhaust temperature based on at least one of a heat transfer coefficient of the equipment, an amount of surface area of contact between airflow and the equipment, a thermal effectiveness of the equipment, a time constant of the equipment, a specific heat of air, an airflow rate, and a position of an effective heat source relative to the mass of the equipment.

14. The system of claim 12, wherein the controller is further configured to calculate the effective temperature and the exhaust temperature based on the physical thermal properties of the equipment by calculating the effective temperature and the exhaust temperature based on at least one of a specific heat of the equipment and the mass of the equipment.

15. A method for measuring parameters of equipment in a data center using a measurement apparatus, the method comprising:
receiving parameters for equipment in the data center, the parameters including information descriptive of mass of the equipment;
measuring, using the measurement apparatus, an input airflow through an inlet of the equipment at a first time period;
calculating an estimated output temperature for each of a plurality of time periods subsequent to the first time period based on the measured input airflow at the first time period and the received parameters;
varying airflow rate and power dissipation associated with the equipment at a predetermined rate using the measurement apparatus;
varying input temperature of the equipment over the plurality of time periods using the measurement apparatus;
measuring, using the measurement apparatus, output temperature of airflow through an exhaust of the equipment using the measurement apparatus; and
calculating an updated output temperature such that the estimated output temperature is configured to be equivalent to the measured output temperature.

16. The method of claim 15, further comprising calculating the estimated output temperature based on internal heat transfer characteristics through the equipment and physical thermal properties of the equipment.

17. The method of claim 15, further comprising:
increasing airflow and power dissipation for the equipment at the predetermined rate until reaching maximum airflow and maximum power dissipation values; and
measuring the output temperature for each of the plurality of time periods.

18. The method of claim 17, further comprising calculating a position of an effective heat source relative to the mass of the equipment such that the estimated output temperature is configured to be equivalent to the measured output temperature.

* * * * *